(12) United States Patent
Miller et al.

(10) Patent No.: US 7,298,036 B2
(45) Date of Patent: Nov. 20, 2007

(54) SCALING OF FUNCTIONAL ASSIGNMENTS IN PACKAGES

(75) Inventors: Leah M. Miller, Fremont, CA (US); Jeffrey A. Hall, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 35 days.

(21) Appl. No.: 11/283,340

(22) Filed: Nov. 18, 2005

(65) Prior Publication Data

US 2007/0114644 A1   May 24, 2007

(51) Int. Cl.
*H01L 23/02* (2006.01)
(52) U.S. Cl. ............... 257/686; 257/777; 257/E23.069; 257/E23.07
(58) Field of Classification Search ............... 257/686, 257/777, E23.069, E23.07
See application file for complete search history.

(56) References Cited

U.S. PATENT DOCUMENTS 6,013,877 A * 1/2000 Degani et al. ............... 174/264

7,112,878 B2 * 9/2006 Akram ....................... 257/686

* cited by examiner

*Primary Examiner*—Long K. Tran
(74) *Attorney, Agent, or Firm*—Luedeka, Neely & Graham, P.C.

(57) ABSTRACT

A family of package substrates adapted to receive a family of integrated circuits having different sizes and provide electrical connections between the integrated circuits and a circuit board. Each package substrate in the family includes a package substrate having a die side and a circuit board side. The package substrate has a size that is consistent for all of the package substrates in the family of package substrates. The die side has integrated circuit contacts disposed in a pattern designed to make electrical connections to a given integrated circuit in the family of integrated circuits for which the package substrate is designed, as defined by locations of contacts on the given integrated circuit. The circuit board side has circuit board contacts disposed in a pattern and with functional assignments that are consistent for all of the package substrates in the family of package substrates.

3 Claims, 1 Drawing Sheet

SCALING OF FUNCTIONAL ASSIGNMENTS IN PACKAGES

FIELD

This invention relates to the field of integrated circuit fabrication. More particularly, this invention relates to the design and construction of package substrates.

BACKGROUND

Integrated circuits are often packaged prior to sale and use, by physically and electrically connecting them to a package substrate, and then covering them in some manner against the package substrate. The package substrate provides all the necessary electrical connections between the electrical contacts for the integrated circuit, on one side of the package substrate, and the electrical contacts on either the printed circuit board or socket, that will connect to the other side of the package substrate.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

As the design of a given integrated circuit evolves, it tends to be reduced in the size of the die on which it is formed. In addition, families of integrated circuits that provide the same basic functionality, but with different options or implementations, may also vary in size. Typically, a different package substrate is designed for use with each one of the different sized devices.

Traditionally, the locations of the electrical connections on both sides of the package substrate are determined based on general routing rules. The electrical connections on the die side of the package substrate are often placed according to the location of the contacts on the die, depending on the type of integrated circuit used. The electrical connections on the board side of the package substrate are often placed according to the easiest method of routing out the connections, allowing for proper signal isolation and other similar considerations. Also, the size of the package substrate that is used for a given die typically varies with the size of the die, with bigger substrates for bigger dice, and smaller substrates for smaller dice. All of this tends to change the pin out locations for each of the different package substrates.

The result of this design and fabrication process is that the package substrates for the dice within a given family of integrated circuits will all tend to have different sizes and different pin outs, just like the different integrated circuits that are mounted to them. Unfortunately, this requires either a different connection pattern or socket on the circuit board that is designed to use the packaged integrated circuit, for each of the different sizes or varieties of integrated circuit that might be used on the circuit board. This adds to the number of different circuit boards that must be produced and inventoried, adds to the complexity of board assembly, and thereby tends to increase costs. This also limits the ability to migrate to a different integrated circuit size during the product definition and development phase.

What is needed, therefore, is a system that overcomes problems such as those described above, at least in part.

SUMMARY

The above and other needs are met by a family of package substrates adapted to receive a family of integrated circuits having different sizes and provide electrical connections between the integrated circuits and a circuit board. Each package substrate in the family includes a package substrate having a die side and a circuit board side. The package substrate has a size that is consistent for all of the package substrates in the family of package substrates. The die side has integrated circuit contacts disposed in a pattern designed to make electrical connections to a given integrated circuit in the family of integrated circuits for which the package substrate is designed, as defined by locations of contacts on the given integrated circuit. The circuit board side has circuit board contacts disposed in a pattern and with functional assignments that are consistent for all of the package substrates in the family of package substrates.

Thus, the preferred embodiments of the present invention provide a means to create a family of packages that allow the die size of the integrated circuit to grow or shrink dramatically, while still maintaining the same pin out for the package. This enables a board designer to create a single board design, independent of any changes that may occur at the die level.

According another aspect of the invention there is described a package substrate adapted to receive a family of integrated circuits having different sizes and provide electrical connections between the integrated circuits and a circuit board. The package substrate includes a package substrate having a die side and a circuit board side. The package substrate has a size that is sufficient to accommodate all of the different sizes in the family of integrated circuits. The die side has integrated circuit contacts disposed in a pattern designed to make electrical connections to the integrated circuits in the family of integrated circuits, as defined by locations of contacts on the integrated circuits. The circuit board side has circuit board contacts disposed in a pattern and with functional assignments that are consistent for all of the integrated circuits in the family of integrated circuits.

According to a further aspect of the invention there is described a family of package substrates adapted to receive a family of integrated circuits having different sizes and provide electrical connections between the integrated circuits and a circuit board. Each package substrate in the family includes a package substrate having a die side and a circuit board side. The package substrate has a size that is consistent for all of the package substrates in the family of package substrates. The die side has integrated circuit contacts disposed in a pattern designed to make electrical connections to a given integrated circuit in the family of integrated circuits for which the package substrate is designed, as defined by locations of contacts on the given integrated circuit. The circuit board side has circuit board contacts disposed in a pattern that is consistent for all of the package substrates in the family of package substrates. The circuit board contacts that are not required to make unique electrical connections to the given integrated circuit are commonly electrically connected within the package substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The preferred embodiments of the present invention provide a means to create a family of packages that allow the die size of the integrated circuit to grow or shrink dramatically, while still maintaining the same pin out for the package. This enables a board designer to create a single board design, independent of any changes that may occur at the die level.

Figure 1:
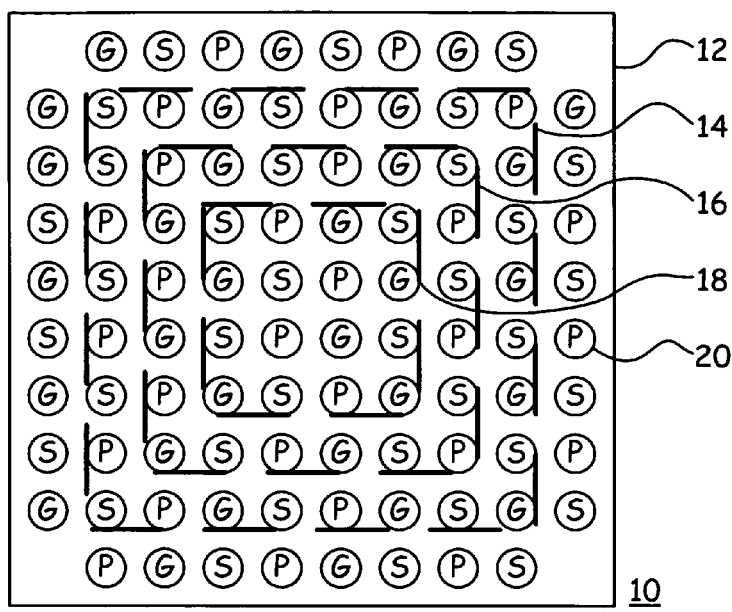
FIG. 1 is a plan view of a ball contact side of a preferred embodiment of a package substrate according to the present invention, depicting in phantom the outer dimensions of three different sizes of integrated circuit that could be used with the package substrate.

With reference now to FIG. 1 there is depicted a plan view of a ball contact side of a preferred embodiment of a package substrate 12 according to the present invention, depicting in phantom the outer dimensions of three different sizes of integrated circuits 14, 16, and 18, that could be used with the package substrate 12. An integrated circuit 14, 16, and 18 together with the package substrate 12 comprise a packaged integrated circuit 10.

Also depicted in FIG. 1 are electrical contacts 20 disposed on the circuit board side of the package substrate 12. The electrical contacts 20 are variously given designations of P for power contacts, G for ground contacts, and S for signal contacts. It is appreciated that these designations are only representative of the various electrical connections that a packaged integrated circuit would require, and the placement of the contacts in the figures is purely by way of example only, without any consideration being made to the appropriateness of the layout.

As depicted in FIG. 1, the package substrates 12 according to the preferred embodiment of the invention are designed to accept several different chip sizes 14, 16, and 18 on the die side, while presenting a common contact pattern 20 on the circuit board side. In various embodiments, either a single package substrate 12 is designed to accommodate more than one different size of integrated circuit 14, 16, and 18, or more preferably, different package substrates 12 are designed to each accommodate a single size of integrated circuit 14, 16, and 18. However, in each case, the package substrates 12 are designed to stay at the same size and to present a consistent contact 20 pattern on the circuit board side of the package substrate 12.

Figure 2:
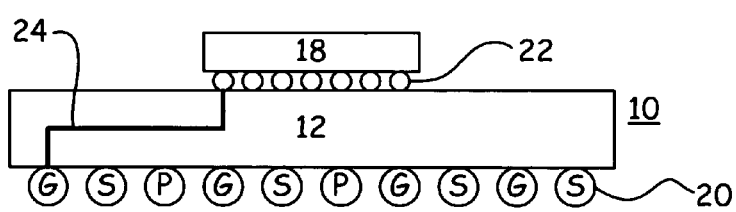
FIG. 2 is a cross section view of the preferred embodiment of the package substrate according to the present invention, depicting a first size of integrated circuit that could be used with the package substrate.

FIG. 2 depicts a cross section view of the preferred embodiment of the package substrate 12 according to the present invention, depicting a first size 18 of integrated circuit that could be used with the package substrate 12. As depicted in FIG. 2, even though the integrated circuit 18 is fairly small, and a smaller package substrate 12 could be used, the size of the package substrate 12 is kept at a standard size. Further, the contacts 20 are kept in a standard pattern, and the electrical connections 24 are routed as appropriate from a given electrical contact 22 on the integrated circuit 18 to a standard contact 20.

Figure 3:
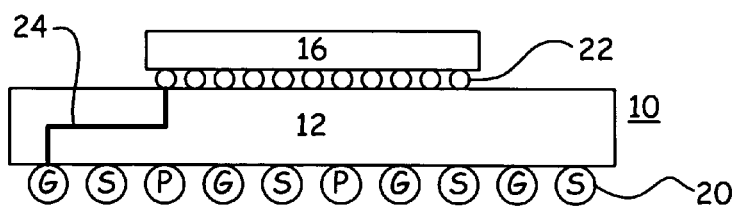
FIG. 3 is a cross section view of the preferred embodiment of the package substrate according to the present invention, depicting a second size of integrated circuit that could be used with the package substrate.

FIG. 3 depicts a cross section view of the preferred embodiment of the package substrate 12 according to the present invention, depicting a second size 16 of integrated circuit that could be used with the package substrate 12. As depicted in FIG. 3, even though the integrated circuit 16 is of an intermediate size, and a smaller package substrate 12 could be used, the size of the package substrate 12 is kept at a standard size. Further, the contacts 20 are kept in a standard pattern, and the electrical connections 24 are routed as appropriate from a given electrical contact 22 on the integrated circuit 16 to a standard contact 20.

Figure 4:
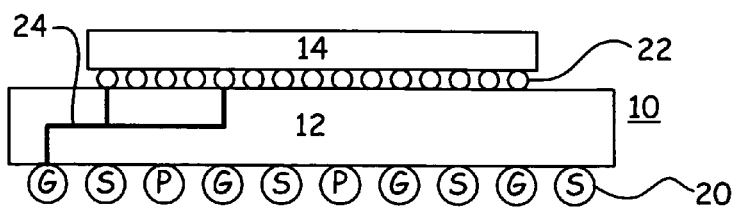
FIG. 4 is a cross section view of the preferred embodiment of the package substrate according to the present invention, depicting a third size of integrated circuit that could be used with the package substrate.

FIG. 4 depicts a cross section view of the preferred embodiment of the package substrate 12 according to the present invention, depicting a third size 14 of integrated circuit that could be used with the package substrate 12. As depicted in FIG. 4, even though the integrated circuit 14 is fairly large, the size of the package substrate 12 is kept at a standard size. Further, the contacts 20 are kept in a standard pattern, and the electrical connections 24 are routed as appropriate from a given electrical contact 22 on the integrated circuit 14 to a standard contact 20.

Thus, the present invention might not reduce the number of different package substrates 12 that are needed to accommodate the various integrated circuit sizes 14, 16, and 18 in all embodiments, but will reduce the number of different designs for a circuit board that is required in order to make use of the different integrated circuits 14, 16, and 18. This is accomplished by providing a consistent contact 20 pattern and pin out on the circuit board side of the package substrate 12 for all of the package substrates 12 in the family.

In this manner, preferably all of the contacts on the circuit board that connect to the contacts 20 of the packaged integrated circuit 10 can be kept in a single pattern for all of the various integrated circuits that might be used in that position on the circuit board. This reduces the number of different circuit boards that must be designed, fabricated, and inventoried, and thus tends to reduce circuit board fabrication costs.

The family of integrated circuits is preferably floor-planned in such a manner so as to allow the migration from one integrated circuit 14, 16, 18 size to another, while maintaining functional equivalency. The package substrate 12, which is common to all integrated circuits 14, 16, 18 of varying sizes in the family, preferably has a set maximum signal count that it can support. This maximum signal count is set to the signal count of the integrated circuit 18 in the family which has the minimum number of signals. For all of the integrated circuits 14, 16 in the family that have connections on the die for a greater number of signals than the minimum signal count family member 18, the signal connections on the die side that exceed the maximum package substrate 12 supported signal count are tied to ground, as depicted in FIG. 4. The ball side connections of the package substrate 12 do not change.

The package substrates according to the preferred embodiments of the present invention also enable the multiple use of test hardware that is employed to access the packaged integrated circuits offered in the package family.

This various embodiments of the present invention can be extended to any package 10 cross section, ball count 20, body size 14, 16, and 18, and varying bump pitches 22. Any integrated circuit package substrate 12 technology, such as BGA, CSP, and so forth, in either ceramic or plastic, or wire bond or flip chip versions can be used with the various embodiments of the invention.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A family of ball bond package substrates adapted to receive a family of integrated circuits having different sizes and provide electrical connections between the integrated circuits and a circuit board, where each package substrate in the family comprises:

a package substrate having a die side and a circuit board side, the package substrate having a size that is consistent for all of the package substrates in the family of package substrates, the die side having ball bond integrated circuit contacts disposed in a pattern designed to make electrical connections to a given one of the different sizes of integrated circuit in the family of integrated circuits for which the package substrate is designed, as defined by locations of contacts on the given integrated circuit, and the circuit board side having circuit board contacts with a same pattern and same functional assignments that are consistent for all of the package substrates in the family of package substrates.

2. A ball bond package substrate adapted to receive a family of integrated circuits having different sizes and provide electrical connections between the integrated circuits and a circuit board, where the package substrate comprises:

a die side and a circuit board side, and having a size that is sufficient to accommodate all of the different sizes in the family of integrated circuits, the die side having ball bond integrated circuit contacts disposed in a pattern designed to make electrical connections to the different sizes of integrated circuits in the family of integrated circuits, as defined by locations of contacts on the integrated circuits, and the circuit board side having circuit board contacts disposed in a pattern and with functional assignments that are consistent for all of the integrated circuits in the family of integrated circuits.

3. A family of ball bond package substrates adapted to receive a family of integrated circuits having different sizes and provide electrical connections between the integrated circuits and a circuit board, where each package substrate in the family comprises:

a die side and a circuit board side, and having a size that is consistent for all of the package substrates in the family of package substrates, the die side having ball bond integrated circuit contacts disposed in a pattern designed to make electrical connections to a given one of the different sizes of integrated circuits in the family of integrated circuits for which the package substrate is designed, as defined by locations of contacts on the given integrated circuit, where integrated circuit contacts that exceed a maximum number of unique integrated circuit contacts are commonly electrically connected within the package substrate, and the circuit board side having circuit board contacts disposed in a pattern that is consistent for all of the package substrates in the family of package substrates.

* * * * *